United States Patent
Bergstrom et al.

[11] Patent Number: 6,087,701
[45] Date of Patent: Jul. 11, 2000

[54] SEMICONDUCTOR DEVICE HAVING A CAVITY AND METHOD OF MAKING

[75] Inventors: Paul L. Bergstrom; Muh-Ling Ger, both of Chandler, Ariz.

[73] Assignee: Motorola, Inc., Schaumburg, Ill.

[21] Appl. No.: 08/997,615

[22] Filed: Dec. 23, 1997

[51] Int. Cl.[7] .............................. H01L 27/14; H01L 29/82
[52] U.S. Cl. .......................... 257/414; 257/415; 257/419
[58] Field of Search .................. 257/414–419, 257/619, 420; 438/48, 49, 50, 51, 52, 53; 73/488, 514.01, 514.16, 514.24, DIG. 1

[56] References Cited

U.S. PATENT DOCUMENTS

| | | | |
|---|---|---|---|
| 5,090,254 | 2/1992 | Guckel et al. | 73/862.59 |
| 5,316,979 | 5/1994 | MacDonald et al. | 438/52 |
| 5,339,051 | 8/1994 | Koehler et al. | 331/65 |
| 5,504,026 | 4/1996 | Kung | 438/50 |
| 5,569,852 | 10/1996 | Marek et al. | 73/514.32 |
| 5,578,755 | 11/1996 | Offenberg | 73/514.32 |
| 5,629,538 | 5/1997 | Lipphardt et al. | 257/417 |
| 5,649,423 | 7/1997 | Shiegowski | 60/531 |
| 5,684,301 | 11/1997 | Cresswell et al. | 257/48 |
| 5,798,283 | 8/1998 | Montague et al. | 438/24 |

OTHER PUBLICATIONS

J.H. Smith et al., "Embedded Micromechanical Devices for the Monolithic Integration of MEMS with CMOS", Proc. 1995 IEDM, pp. 609–612.

*Primary Examiner*—Tom Thomas
*Assistant Examiner*—Hung K. Vu
*Attorney, Agent, or Firm*—Daniel R. Collopy; A. Kate Huffman

[57] ABSTRACT

A semiconductor device (50) has a sensing element (30) and a transistor (40). The sensing element (30) is formed in a cavity (11) in a substrate (10). The sensing element (30) is formed in part using an epitaxial deposition process that fills the cavity (11) with a conductive material (18) such as polysilicon. A dielectric layer (17) is used to electrically isolate the sensing element (30) from the substrate (10).

18 Claims, 2 Drawing Sheets

SEMICONDUCTOR DEVICE HAVING A CAVITY AND METHOD OF MAKING

BACKGROUND OF THE INVENTION

This invention relates, in general, to semiconductor devices, and more particularly, to sensing devices formed as part of an integrated circuit.

Sensing devices such as accelerometers, gyros, pressure sensors, and the like are well known in the art. In order to maximize the functionality of the sensing device, it is desirable to form the sensing element on a substrate with neighboring logic transistors such as field effect transistors (FETs) that monitor the information generated by the sensing element and provide the proper electrical response. To minimize the manufacturing cost of an integrated circuit having a sensing element, it is desirable to integrate the process used to make the sensing element with the process used to make the FETs.

One problem with forming a sensing element on the same substrate that is used to form FETs is that the topography commonly associated with sensing elements complicates the photolithographic process used to define the FETs. Commonly, sensing elements have topographies that are in excess of a micron. Such topography makes it difficult to evenly dispense photoresist across a substrate and requires a photolithographic process that has a depth of focus that is sufficient to resolve the topography.

Presently, there are two unrelated approaches to solving this problem. The first approach forms a layer of epitaxial silicon on a substrate. Bipolar transistors are formed in the epitaxial silicon layer and a sensor is carved out of the epitaxial layer. An example of this approach is shown in a paper by P. T. Gennissen et al., "Applications of bipolar compatible epitaxial polysilicon", SPIE Vol. 2882, pages 59–65. However, this technique involves the added complexity of forming epitaxial layers and provides only limited electrical isolation between the sensor and the epitaxial layer.

An example of a different approach is shown in a paper by J. H. Smith et al., "Embedded Micro mechanical Devices for the Monolithic Integration of MEMS with CMOS", Proc. 1995 IEDM, pages 609–612. In general, this alternative approach relies on the simplicity of complementary metal-oxide semiconductor (CMOS) processing steps to form a sensor in a recessed cavity. However, this approach is limited to the capability of conventional chemical vapor deposition (CVD) techniques. In particular, CVD processes are limited in the thickness of the films that can be formed. Consequently, sensors formed with this approach are limited in their maximum size and topography.

Accordingly, a need exists to provide a method of forming an integrated circuit that has a sensing element that obviates the problems associated with the topography of the sensing element. Such a device would be less complicated to fabricate, and thus, could be made more reliably and at a lower manufacturing cost than previously known devices.

Figure 1:
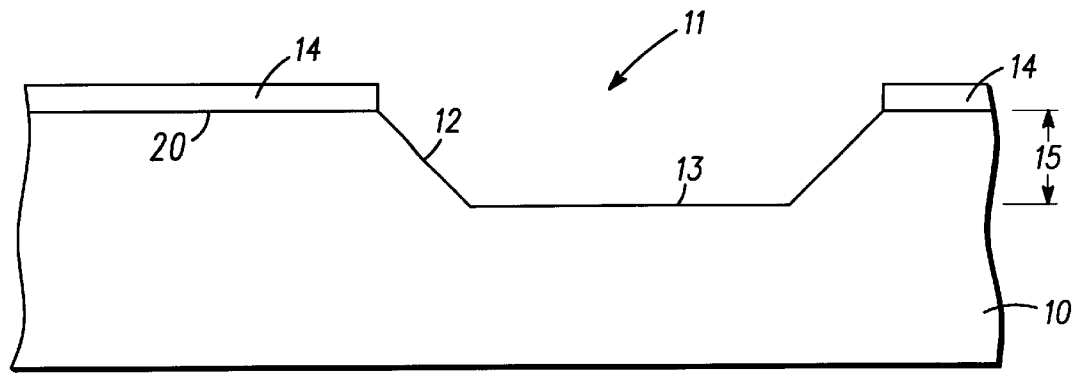
FIGS. 1–4 are cross-sectional views of a semiconductor device at various steps in the manufacturing process of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is cross-sectional view of a semiconductor device 50 at an early stage in the manufacturing process of the present invention. Preferably, semiconductor device 50 is an integrated circuit comprising a sensing element and a transistor that is used to process information generated by the sensing element. As explained in more detail below, the process of the present invention forms a sensing element in a recessed cavity so that the topography associated with the sensing element does not affect the formation of transistors on the top surface of the substrate.

In the example provided below, semiconductor device 50 is formed on a substrate 10. Substrate 10 is a single-crystal homogenous substrate made of a uniform material such as silicon. In other embodiments, substrate 10 could be made from other uniform materials and could be a compound semiconductor substrate such as gallium-arsenide, indium-phosphide or the like.

The formation of semiconductor device 50 includes forming a hard mask 14 on a top surface 20 of substrate 10. Hard mask 14 can be a single layer or a multiple-layer stack of commonly used masking materials such as silicon dioxide or silicon nitride. A chemical vapor deposition (CVD) or plasma enhanced chemical vapor deposition (PECVD) process can be used to form hard mask 14. A photolithographic mask and etch process is used to pattern hard mask 14 and expose a portion of the top surface 20 of substrate 10.

Thereafter, an etch process is used to form a cavity 11 so that cavity 11 extends from the top surface 20 of substrate 10. A variety of techniques can be used to form cavity 11 such as a wet etch process or a reactive ion etch (RIE) process. Preferably, a wet etch solution containing hydrofluoric acid, tetramethylammoniumhydroxide (TMAH), or potassium hydroxide is used. A wet etch process forms cavity 11 such that it has side surfaces 12 that are tapered down to a bottom surface 13. As shown in FIG. 1, the side surfaces 12 and the bottom surface 13 of cavity 11 expose portions of substrate 10 that are made of the same uniform material (i.e., cavity 11 exposes portions of substrate 10 that are consistent, homogenous, and preferably have the same doping concentration or resistivity).

The depth of cavity 11 (indicated in FIG. 1 with a bracket 15) can be controlled by the length of the etch processes so that cavity 11 is sufficiently deep to contain the sensing element to be formed therein. Preferably, cavity 11 is at least 1 micron deep, and typically has a depth of at least 4 to 6 microns. As will be explained further below, previously known techniques for forming sensing elements are limited by the deposition process used to form the sensor. These deposition process have difficulty forming layers that are more than 1 micron thick. Consequently, the depth of any cavity formed to contain the sensing element is also limited. In contrast, the present invention does not suffer from the same process limitations, and thus, the depth of cavity 11 and the topography of a sensing element formed in cavity 11 are no longer limited due to thickness constraints. Therefore, the depth of cavity 11 can be greater than 4 microns or even greater than 6 microns if desired.

Figure 2:
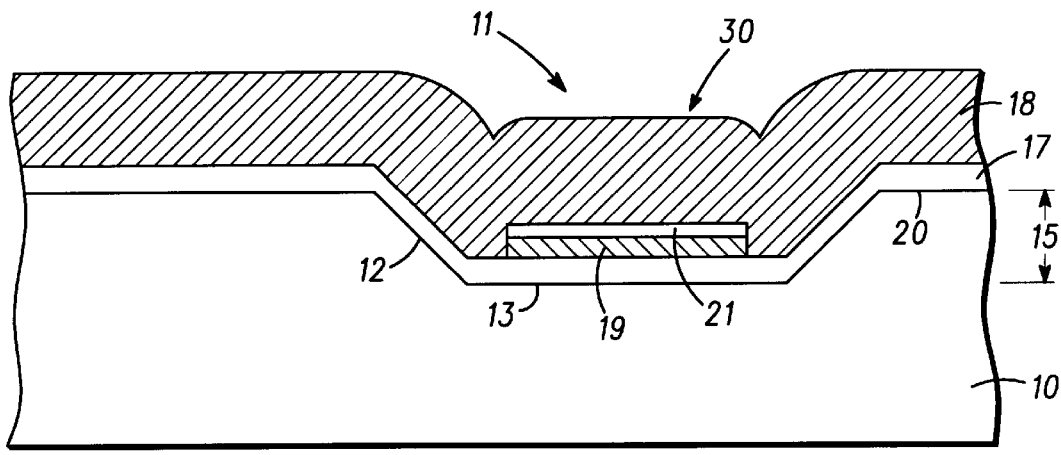

Referring now to FIG. 2, the manufacture of semiconductor device 50 continues by removing hard mask 14 with the appropriate wet etch process. A dielectric layer 17 is formed along the top surface 20 of substrate 10 and along the side and bottom surfaces 12 and 13 of cavity 11. Dielectric layer 17 is formed using a thermal oxidation process to grow a layer of silicon dioxide that is about 100 angstroms (Å) to 5,000 Å thick. It is also possible to form dielectric layer 17 using a CVD or PECVD process that deposits silicon dioxide, silicon nitride, or similar material. Dielectric layer 17 is formed along the exposed surfaces of cavity 11 so that the sensing element to be formed in cavity 11 is electrically isolated from substrate 10.

Thereafter, the process of forming semiconductor device 50 continues with the formation of a sensing element 30 in cavity 11. In the example that follows, sensing element 30 is an accelerometer that is used to sense the magnitude and direction of acceleration applied by semiconductor device 50. It should be understood that the example that follows is only one particular embodiment of the present invention. Sensing element 30 can be a variety of sensing devices including a gyro, a valve, a movable parallel plate capacitor, a pressure sensor, a chemical sensor, or the like. Furthermore, in the following example sensing element 30 is formed such that it is entirely disposed within cavity 11. It is also possible to form sensing element 30 so that a majority or even only a small portion of sensing element 30 is formed within cavity 11.

A lower portion 19 of sensing element 30 is formed by depositing and patterning a layer of conductive material over the bottom surface 13 of cavity 11. Preferably, the lower portion of sensing element 30 is made from polysilicon that is formed using a CVD process, but other suitable materials such as aluminum or the like may be used. The lower portion 19 of sensing element 30 is used to provide electrical connection between sensing element 30 and transistors to be formed on substrate 10.

A sacrificial material such as silicon dioxide, phosphosilicate glass (PSG), or the like is formed and patterned within cavity 11 to provide a temporary structure 21. Temporary structure 21 is used to define portions of sensing element 30 and is used to provide the necessary air gaps within sensing element 30 when temporary structure 21 is subsequently removed.

A layer of conductive material, hereinafter referred to as conductive material 18, is formed over dielectric layer 17 and temporary structure 21. Conductive layer 18 is formed by placing substrate 10 into an epitaxial reactor (not shown) and depositing a layer of polysilicon with an epitaxial deposition process. During the formation of conductive layer 18, the appropriate dopant is added to the reaction process so that conductive material 18 has the desired electrical characteristics. Typically, epitaxial deposition processes are used to form a layer of silicon that replicates the single-crystal pattern of an underlying substrate. However, in the present invention, the deposition of a silicon layer results in a layer that is polycrystalline in nature because the underlying dielectric layer 17 and temporary structure 21 are amorphous in nature so there is no crystal lattice pattern to repeat.

The advantage of using a single deposition process in an epitaxial reactor is that the thickness of conductive material 18 is not limited as is the case in previously known manufacturing processes that use CVD. Conventional CVD deposition processes have a practical limit in that they can only be used to deposit films up to about two microns in thickness. Due to the nature of CVD processes, it is not possible to form films thicker than two microns due the slower deposition rate and because of the amount of particulates that buildup along the inside of CVD reaction chambers. Consequently, sensing elements formed from CVD deposition processes must be formed using a plurality of depositions. Furthermore, the depth of a cavity used to contain a sensing element made using CVD processes is limited due to the step coverage in the cavity and the maximum thickness of the film that can be deposited with a CVD process.

In contrast, the use of an epitaxial process in the present invention takes advantage of the capability of forming polysilicon films with a greater thickness using only one deposition process. Consequently, the depth of cavity 11 can be increased if desired, and the manufacturing cost of forming semiconductor device 50 is reduced by obviating the need to use multiple CVD processes to form a sensing element. The process of the present invention is also simpler than previously known processes in that the epitaxial process can be used to fill cavity 11 completely with conductive material 18. In other words, conductive material 18 preferably has a thickness greater than a depth of cavity 11. This is desirable because the effect the topography of cavity 11 has on the photolithographic process can be significantly reduced by filling any unused portions of cavity 11 with conductive material 18.

Figure 3:
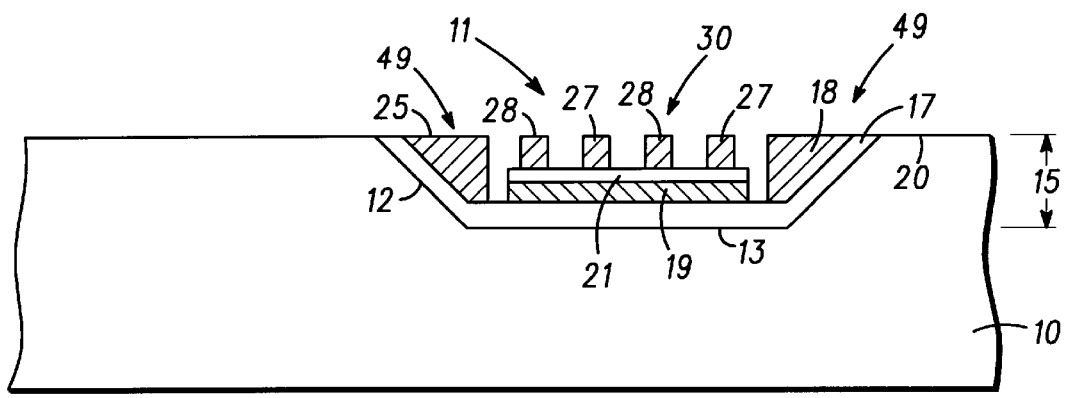

Turning now to FIG. 3, the formation of semiconductor device 50 continues with the use of an appropriate chemical-mechanical polish (CMP) process that is used to remove the excess portions of conductive material 18 and to provide a planar surface 25 that is substantially planar with a top surface 26 of dielectric layer 17. In the preferred process, dielectric layer 17 serves as an etch stop for the CMP process and also serves to prevent the top surface 20 of substrate 10 from being exposed during the CMP process. It may be desirable to allow the CMP process to continue so that the portion of dielectric layer 17 on the top surface 20 of substrate 10 is also removed. Therefore, the planar surface 25 of conductive material 18 would be substantially planar with the top surface 20 of substrate 10.

A photolithographic mask and etch process are used to pattern conductive layer 18, such as is shown in FIG. 3, to define the remainder of sensing element 30. In this example, conductive material 18 provides fingers 27 and 28, which are used to sense acceleration applied to semiconductor device 50. As shown, a portion of conductive material 18 remains along the side surface 12 of cavity 11 to provide a ring of material 49. This portion of conductive material 18 remains to minimize the effect on the subsequent photolithographic processes from the topography of sensing element 30 or the presence of cavity 11. This portion of conductive material 18 (ring 49) is electrically isolated from substrate 10 because dielectric layer 17 is between the side surface 12 of cavity 11 and conductive material 18.

The amount of cavity 11 that is filled by conductive material 18 can vary and depends largely on the configuration of sensing element 30. In many embodiments of the present invention, it would be expected that at least a majority of cavity 11 is filled with conductive material 18 because of the portions (ring 49) that are along the side surface 12 of cavity 11.

Figure 4:
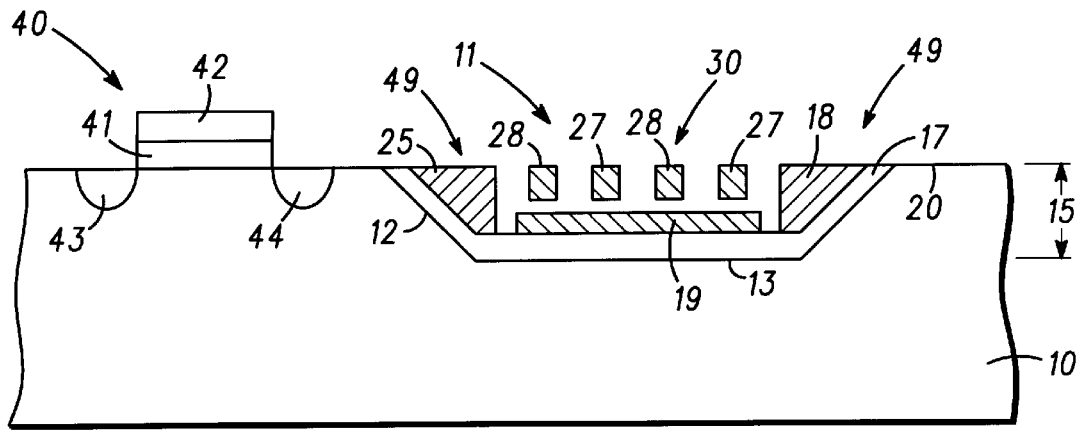

Referring now to FIG. 4, the formation of semiconductor device 50 continues with the formation of a transistor 40 such as an FET. Transistor 40 is formed using conventional techniques after a portion of dielectric layer 17 is removed to expose an underlying portion of substrate 10. In the example shown in FIG. 4, transistor 40 includes a gate structure made from a layer of silicon dioxide 41 and a layer of polysilicon 42. Transistor 40 also has a source region 43 and a drain region 44 that extend from the top surface 20 of substrate 10. Transistor 40 can be electrically connected to sensing element 30 so that transistor 40 either detects or determines the magnitude of acceleration or provides the desired electrical response when an acceleration is detected with sensing element 30.

Thereafter, a wet etch process is used to remove temporary structure 21 (see FIG. 3) so that fingers 27 and 28 are released and free to move. A wet etch solution of hydrofluoric acid or similar etchant can be used to remove the sacrificial material in cavity 11. In the example provided above, transistor 40 is formed after the layers that make up sensing element 30 are deposited. It should be understood that it may be desirable to form transistor 40 prior to forming cavity 11 and conductive material 18 in some applications. It may also be desirable to deposit a second layer of sacrificial material (not shown) between fingers 27 and 28 to fill the gaps between fingers 27 and 28 as transistor 40 is being formed. Finally, it may be desirable to make electrical contact to sensing element 30 from its top surface rather than through the use of lower portion 19 as described above.

Figure 5:
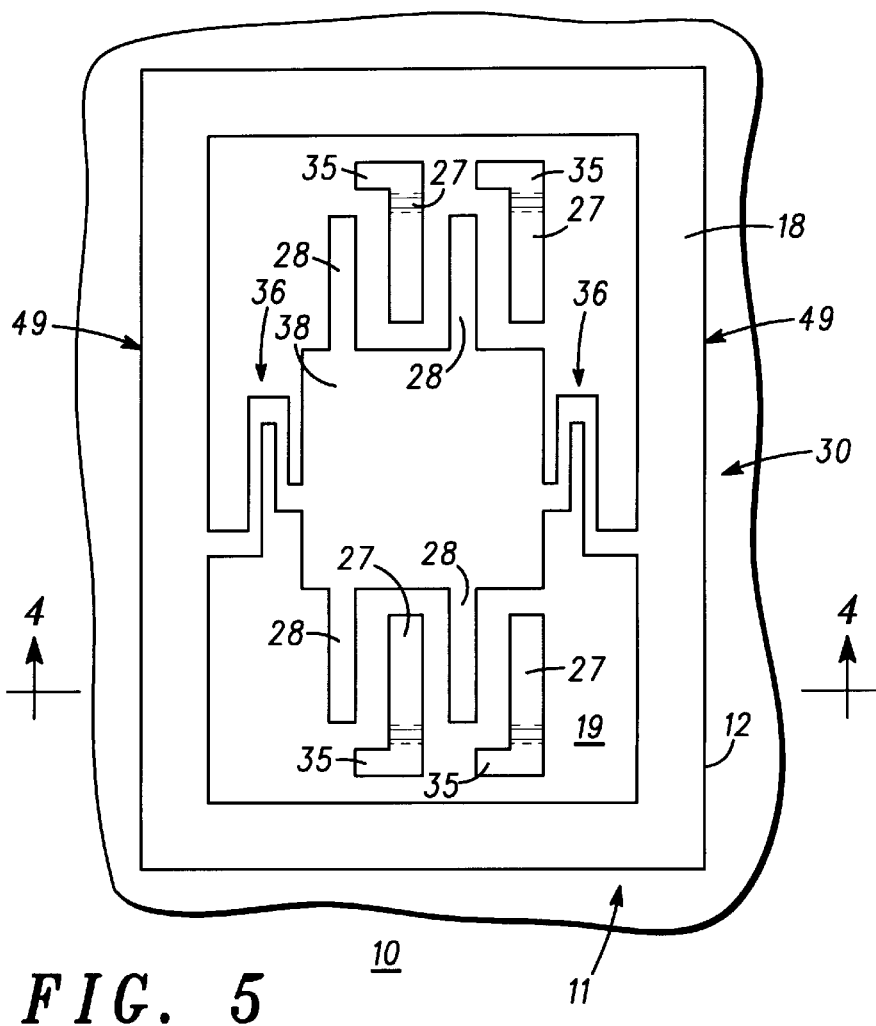
FIG. 5 is a top view of a portion of a sensing element in accordance with the present invention.

FIG. 5 is provided to illustrate the spatial relationship of sensing element 30 within cavity 11 and how a portion of conductive material 18 remains to provide a planar surface. Sectional lines 4—4 are used to indicate the portion of sensing element 30 that is shown in cross-section in FIG. 4. As described above, conductive material 18 is patterned so that ring 49 remains along the side surface 12 of cavity 11. Sensing element 30 also includes a seismic mass 38, which moves in response to acceleration, and spring regions 36, which are used to affix seismic mass 38 to ring 49. Ring 49, seismic mass 38, and spring regions 36 are all formed from conductive material 18. As shown, fingers 28 of sensing element 30 are attached to seismic mass 38 and move as seismic mass 38 moves. As a result of the patterning of temporary structure 21 (see FIG. 3 and related text above), fingers 27 are attached to the lower portion 19 of sensing element 30 at anchor regions 35. Consequently, capacitive coupling between fingers 27 and fingers 28 is used to sense the motion of seismic mass 38, and thus, the acceleration applied to semiconductor device 50.

It should be understood that the sensing element 30 described above is only one of a variety of possible sensing elements that can be formed within cavity 11. By forming multiple temporary and permanent structures within cavity 11, it is possible to form accelerometers with other configurations and even form other types of sensing elements.

It is worth pointing out some of the distinctions between the process of the present invention and previously known process. The process of the present invention includes forming a cavity that has a side surface that defines a perimeter of the cavity. The cavity is filled with a conductive material using an epitaxial deposition process, and then the conductive material is patterned to form a portion of a sensing element. Some of the conductive material remains along at least a portion of the perimeter of the cavity. More preferably, the conductive material remains along the entire perimeter of the cavity.

This process is inherently different in that previously known techniques involve only partially filling the cavity with a conductive material using a CVD process and then filling the remainder of the cavity with a dielectric material such as PSG. Consequently, previously known process result in a cavity structure that has a dielectric material along the perimeter of the cavity. The process of the present invention is more desirable because it obviates the need to use an additional deposition process to fill a cavity with PSG and allows a sensing element to be formed in a deeper cavity using a process that has the capability of forming a thicker film. This both reduces the manufacturing cost and offers flexibility in the design of semiconductor devices have sensing elements.

The present invention also differs from previously known techniques in that preferably the cavity of the present invention is formed in a substrate of uniform material, rather than in a layer of epitaxial silicon on a silicon substrate as is known in the art. Consequently, the present invention obviates the need to bond layers together or to perform an extra epitaxial deposition step to form a layer of epitaxial silicon on a silicon substrate. The present invention also provides for the formation of a dielectric layer along the surfaces of the cavity so that a sensing element formed in the cavity is electrically isolated from the substrate.

We claim:

1. A semiconductor device having a sensor, the sensor comprising:

a substrate having a cavity and a surface, wherein the cavity exposes portions of the substrate made from an uniform material and has a side surface and a bottom surface, the side surface extending from the surface of the substrate to the bottom surface of the cavity;

a layer of conductive material along at least a portion of the side surface of the cavity, the conductive material layer having a surface substantially planar to the surface of the substrate; and a sensing element that is at least partially disposed within the cavity.

2. The semiconductor device of claim 1 further comprising:

a dielectric layer disposed in the cavity providing electrical isolation between the sensing element and the substrate.

3. The semiconductor device of claim 2 wherein the dielectric layer is between the side surface of the cavity and the layer of conductive material.

4. The semiconductor device of claim 1 wherein the layer of conductive material is disposed within the cavity.

5. The semiconductor device of claim 1 wherein the layer of conductive material comprises polysilicon.

6. The semiconductor device of claim 1 wherein the cavity has a depth of at least 1 micron.

7. The semiconductor device of claim 6 wherein the cavity has a depth of at least 4 microns.

8. A semiconductor device comprising:

a substrate having a cavity, wherein the cavity has a side surface and a bottom surface;

a layer of conductive material formed within the cavity and over the side surface of the cavity, the conductive material layer having a surface substantially planar to the surface of the substrate; and a sensing element at least partially disposed within the cavity.

9. The semiconductor device of claim 8 wherein the cavity is further defined by a side surface that defines a perimeter of the cavity, and the layer of conductive material is along at least a portion of the perimeter of the cavity.

10. The semiconductor device of claim 9 further comprising a layer of dielectric material along at least a portion of the side surface of the cavity, wherein the layer of dielectric material is between the side surface of the cavity and the layer of conductive material.

11. The semiconductor device of claim 9 wherein the side surface of the cavity is tapered.

12. The semiconductor device of claim 9 wherein the layer of conductive material is disposed within the cavity.

13. The semiconductor device of claim 12 wherein the layer of conductive material is along the entire perimeter of the cavity.

14. The semiconductor device of claim 8 wherein a majority of the cavity is filled with the layer of conductive material.

15. The semiconductor device of claim 8 wherein the substrate has a top surface, and the semiconductor device further comprises a transistor coupled to the sensing element and having a source region and a drain region that extend from the top surface of the substrate.

16. The semiconductor device of claim 15 wherein the sensing element has a top portion that is substantially planar with the top surface of the substrate.

17. A semiconductor device having a sensor, the sensor comprising:

a substrate having a cavity, wherein the cavity has a first side surface, a second side surface, and a bottom surface, the bottom surface being between the first side surface and the second side surface;

a layer of conductive material over at least a portion of the first side surface of the cavity, the conductive material layer having a surface substantially planar to the surface of the substrate; and a sensing element that is at least partially disposed within the cavity.

18. The semiconductor device of claim 17 wherein the cavity exposes portions of the substrate made from an uniform material.

* * * * *